(12) United States Patent
Yamane et al.

(10) Patent No.: US 12,726,008 B2
(45) Date of Patent: Sep. 1, 2026

(54) WIRING STRUCTURE

(71) Applicant: ISUZU MOTORS LIMITED, Yokohama (JP)

(72) Inventors: Futoshi Yamane, Fujisawa (JP); Takuya Kikuchi, Fujisawa (JP)

(73) Assignee: ISUZU MOTORS LIMITED, Yokohama (JP)

( * ) Notice: Subject to any disclaimer, the term of this patent is extended or adjusted under 35 U.S.C. 154(b) by 182 days.

(21) Appl. No.: 18/644,374

(22) Filed: Apr. 24, 2024

(65) Prior Publication Data

US 2024/0364085 A1 Oct. 31, 2024

(30) Foreign Application Priority Data

Apr. 27, 2023 (JP) ................................ 2023-073535

(51) Int. Cl.

| | |
|---|---|
| ***H02G 3/08*** | (2006.01) |
| ***B60R 16/02*** | (2006.01) |
| ***B60R 16/023*** | (2006.01) |
| ***H02G 3/38*** | (2006.01) |
| ***H05K 9/00*** | (2006.01) |

(52) U.S. Cl.

CPC ......... *H02G 3/081* (2013.01); *B60R 16/0207* (2013.01); *B60R 16/0215* (2013.01); *B60R 16/0238* (2013.01); *H02G 3/28* (2013.01); *H05K 9/0098* (2013.01)

(58) Field of Classification Search

CPC ...... H02G 3/081; H02G 3/28; B60R 16/0238; B60R 16/0207; B60R 16/0215; H05K 9/0098; H05K 9/0007; H05K 7/02; H05K 9/0064

See application file for complete search history.

(56) References Cited

U.S. PATENT DOCUMENTS

| | | | | |
|---|---|---|---|---|
| 5,403,974 A * | 4/1995 | Leach | .................... | H02G 3/105 361/828 |
| 6,294,733 B1 * | 9/2001 | Gibbons | ............. | H05K 9/0015 174/151 |
| 2011/0180336 A1 * | 7/2011 | Kurata | .................... | B60L 53/22 180/65.1 |

(Continued)

FOREIGN PATENT DOCUMENTS

| | | |
|---|---|---|
| JP | 2006080215 A | 3/2006 |
| JP | 2010087261 A | 4/2010 |

(Continued)

OTHER PUBLICATIONS

English Translation JP2006080215; Yosuaki et al.; Nissan Motor Co Ltd.; Published Mar. 23, 2006 (Year: 2006).*

*Primary Examiner* — Steven T Sawyer
(74) *Attorney, Agent, or Firm* — Shih IP Law Group, PLLC

(57) ABSTRACT

A wiring structure that can prevent generation of radio noise is provided. A wiring structure includes: two electrical/electronic components mounted in a vehicle, and including respective shield cases connected to a chassis ground; and a shield wire including a center conductor, and an outer conductor covering an outer periphery of the center conductor. Both ends of the shield wire are extended to the shield cases, at least one of the shield cases includes an insulation part, and the outer conductor of one end of the shield wire extended to the at least one of the shield cases is connected to the insulation part.

2 Claims, 2 Drawing Sheets

(56) References Cited

U.S. PATENT DOCUMENTS

| | | | | |
|---|---|---|---|---|
| 2012/0045353 | A1 | 2/2012 | Watanabe | |
| 2015/0366111 | A1* | 12/2015 | Yagi | H02M 1/44 174/350 |
| 2017/0197563 | A1* | 7/2017 | Weber | H05K 9/0064 |
| 2017/0294764 | A1 | 10/2017 | Shimizu | |
| 2018/0183400 | A1* | 6/2018 | Mizutani | B60R 16/0215 |
| 2018/0205356 | A1* | 7/2018 | Hirata | H03H 7/0115 |
| 2018/0277282 | A1* | 9/2018 | Mizutani | H01B 7/1875 |
| 2023/0007816 | A1* | 1/2023 | Tournabien | H05K 7/20336 |

FOREIGN PATENT DOCUMENTS

| | | | |
|---|---|---|---|
| JP | 2011-069247 | A | 4/2011 |
| JP | 2012239350 | A | 12/2012 |
| JP | 6157677 | B1 | 7/2017 |
| WO | 2018012144 | A1 | 1/2018 |

* cited by examiner

WIRING STRUCTURE

CROSS REFERENCE TO RELATED APPLICATIONS

The entire disclosure of Japanese patent Application No. 2023-073535 filed on Apr. 27, 2023, is incorporated herein by reference in its entirety.

TECHNOLOGICAL FIELD

The present disclosure relates to a wiring structure.

BACKGROUND ART

Electrical/electronic components mounted in automobiles are an easy noise source.

For example, in the case where one of two components mounted in an automobile is a noise source, the noise is brought to the ground through a shield wire and the other component by connecting the one component to the other component through the shield wire, and chassis-grounding the other component.

For example, Japanese Patent Application Laid-Open No. 2011-069247 discloses, as a noise removing technique, a noise removing filter circuit provided on a wiring path for supplying a direct current power to a power device, for example.

In the case where two components are connected through a high voltage harness in electric vehicles such as electric cars, each component is chassis-grounded so as to form a ground loop in which the current from the noise source goes through the chassis ground and returns to the noise source, for example. This generates radio noise (common mode noise). As a result, the EMC tolerance deteriorates.

SUMMARY OF INVENTION

Technical Problem

An object of the present disclosure is to provide a wiring structure that can prevent generation of radio noise.

To achieve the above-mentioned object, a wiring structure in the two present disclosure includes: electrical/electronic components in a vehicle, and including respective shield cases connected to a chassis ground; and a shield wire including a center conductor, and an outer conductor covering an outer periphery of the center conductor. Both ends of the shield wire are extended to the shield cases, at least one of the shield cases includes an insulation part, and the outer conductor of one end of the shield wire extended to the at least one of the shield cases is connected to the insulation part.

BRIEF DESCRIPTION OF DRAWINGS

The advantageous and features provided by one or more embodiments of the invention will become more fully understood from the detailed description given hereinbelow and the appended drawings which are given by way of illustration only, and thus are not intended as a definition of the limits of the present invention.

DESCRIPTION OF EMBODIMENTS

Hereinafter, one or more embodiments of the present invention will be described with reference to the drawings. However, the scope of the invention is not limited to the disclosed embodiments.

Figure 1:
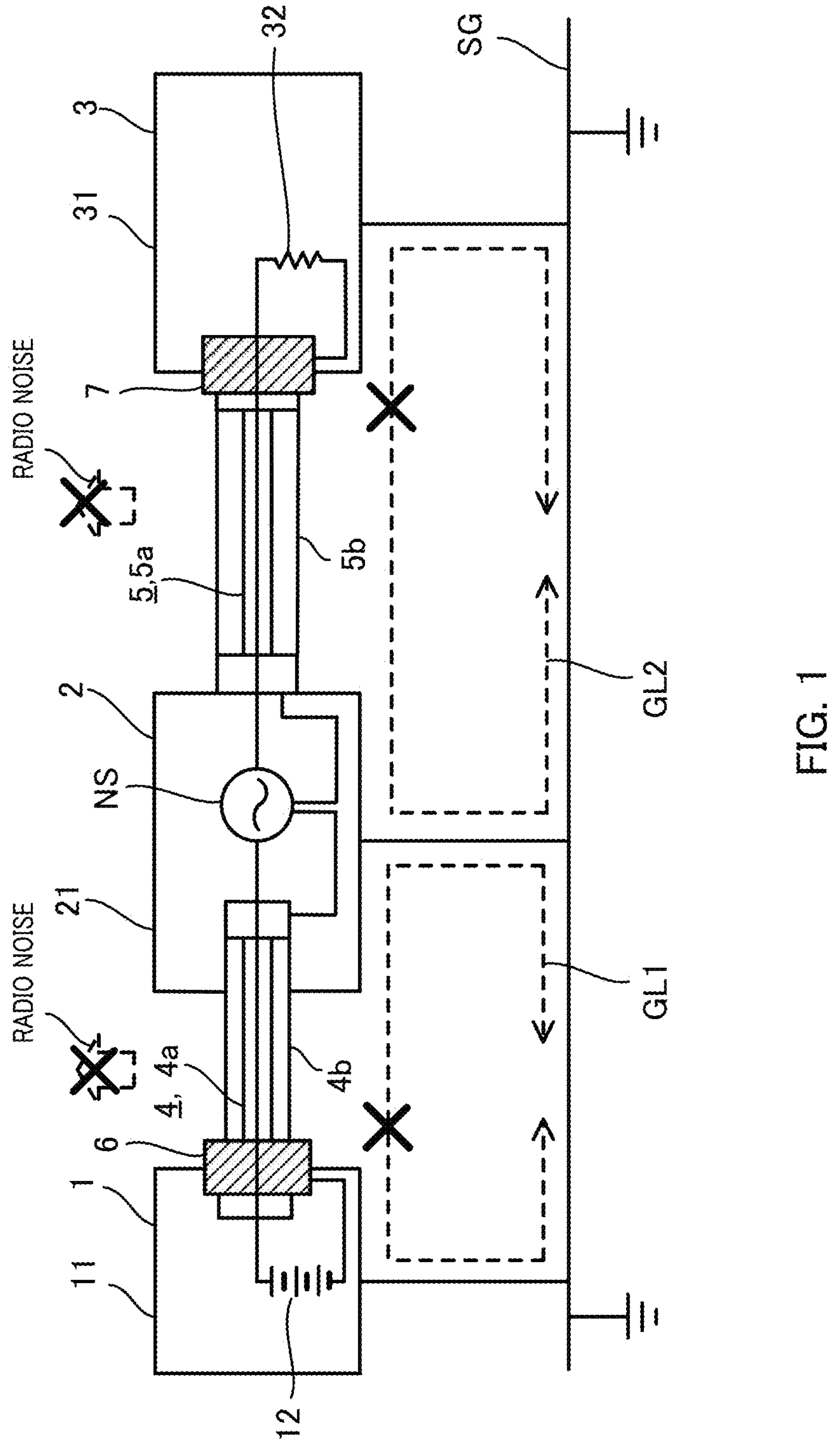
FIG. 1 is a diagram illustrating an example of a wiring structure of an embodiment of the present disclosure.

An embodiment of the present disclosure is described below with reference to the drawings. An example of a wiring structure of the embodiment of the present disclosure is described below with reference to FIG. 1. FIG. 1 is a diagram illustrating an example of a wiring structure of an embodiment of the present disclosure. The automobile of the embodiment of the present disclosure is an electric vehicle (EV) that runs with an electric motor (motor) as the power source. In addition, a case where the EV is provided with two electrical/electronic components is described for the sake of the ease of description.

In the EV, component 1, component 2, and component 3 are mounted. In the present embodiment, component 1 is a battery. The power from component 1 (battery) is supplied to component 3 through component 2. Component 2 is a noise source NS (signal source). Here, noise source NS is, for example, a switch element.

Shield wire 4 extends between component 1 (battery) and component 2. Shield wire 4 includes center conductor 4*a*, and outer conductor 4*b* that covers the outer periphery side of center conductor 4*a*.

Shield wire 5 extends between component 2 and component 3. Shield wire 5 includes center conductor 5*a*, and outer conductor 5*b* that covers the outer periphery of center conductor 5*a*.

Component 1

Component 1 includes shield case 11 connected to chassis ground SG. Battery pack 12 is provided inside shield case 11. The plus terminal of battery pack 12 is connected to one end of center conductor 4*a*. The minus terminal of battery pack 12 is connected to insulation part 6. In other words, the minus terminal of battery pack 12 is indirectly connected to one end of outer conductor 4*b* through insulation part 6.

Component 2

Component 2 includes shield case 21 connected to chassis ground SG. There is noise source NS inside shield case 21 as described above. The input side terminal of noise source NS is connected to the other end of center conductor 4*a*. The ground side terminal of noise source NS is connected to the other end of outer conductor 4*b*.

The output side terminal of noise source NS is connected to one end of center conductor 5*a*. The ground side terminal of noise source NS is connected to one end of outer conductor 5*b*.

Component 3

Component 3 includes shield case 31 connected to chassis ground SG. Load 32 to which the power from component 1 (battery) is supplied is provided inside shield case 31. Here, load 32 is, for example, an electric motor. One terminal of load 32 is connected to the other end of center conductor 5*a*. The other end of load 32 is connected to insulation part 7. In other words, the other end of load 32 is indirectly connected to the other end of outer conductor 5*b* through insulation part 7.

Ground of Wiring Structure

With the wiring structure composed of component 1, component 2 and shield wire 4, the ground side terminal of noise source NS is connected to the other end of outer conductor 4*b*. On the other hand, the minus terminal of battery pack 12 is not connected to the one end of outer conductor 4*b*. In this manner, ground loop GL1 is not formed because the current from noise source NS does not flow from the minus terminal of battery pack 12 to chassis ground SG, and does not return to noise source NS through chassis ground SG. That is, a single point ground is formed. As a result, generation of radio noise can be prevented. In FIG. 1, the mark "x" indicates that ground loop GL1 is not formed. In addition, in FIG. 1, the mark "x" indicates that generation of radio noise is prevented.

With the wiring structure composed of component 2, component 3 and shield wire 5, the ground side terminal of noise source NS is connected to one end of outer conductor 5*b*. On the other hand, the other end of load 32 is not connected to the other end of outer conductor 5*b*. In this manner, ground loop GL2 is not formed because the current from noise source NS does not flow from the other end of load 32 to chassis ground SG, and does not return to noise source NS through chassis ground SG. That is, a single point ground is formed. As a result, generation of radio noise can be prevented. In FIG. 1, the mark "x" indicates that ground loop GL2 is not formed. In addition, in FIG. 1, the mark "x" indicates that generation of radio noise is prevented.

Wiring Structure of Comparative Example

Figure 2:
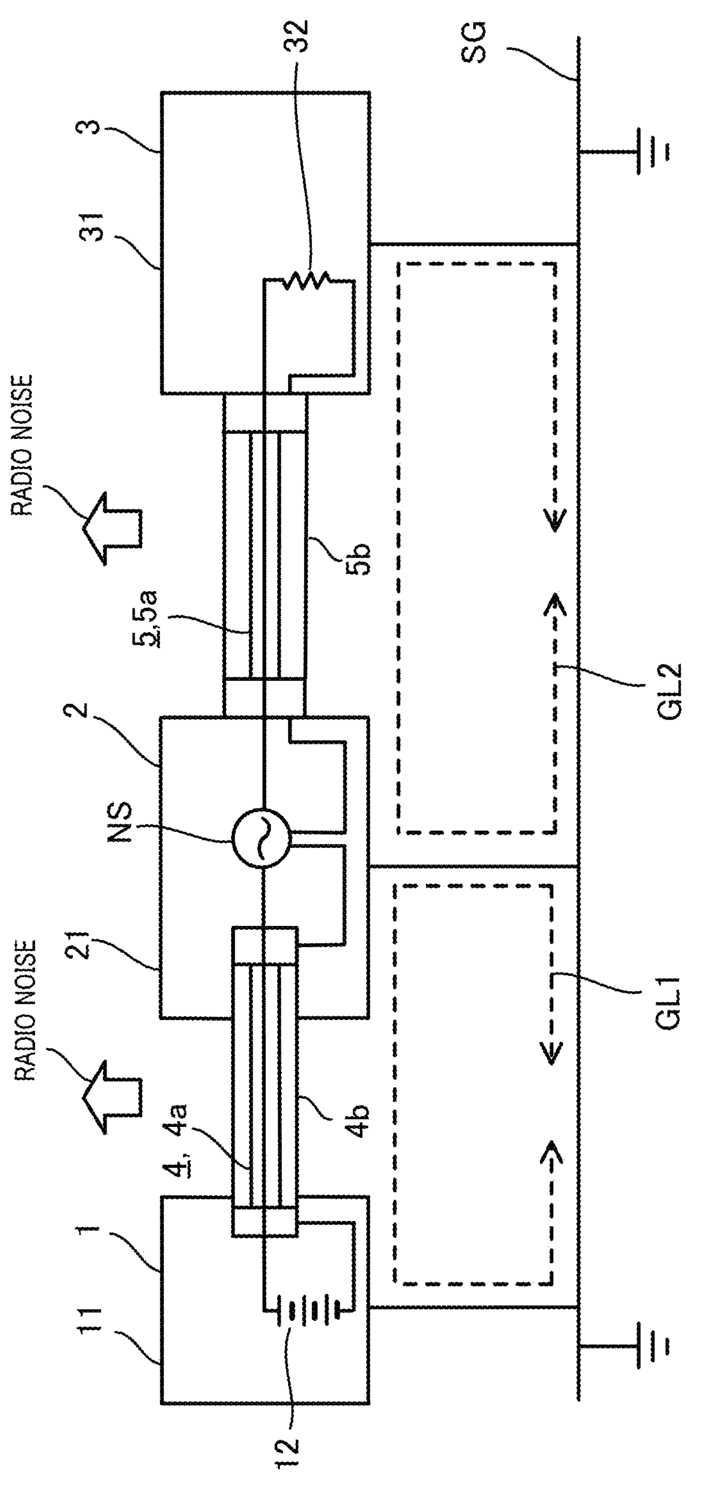
FIG. 2 is a diagram illustrating an example of a wiring structure of a comparative example.

Next, an example of a wiring structure of a comparative example is described below with reference to FIG. 2. FIG. 2 is a diagram illustrating an example of a wiring structure of a comparative example. Note that for the wiring structure of the comparative example, differences from the configuration of the wiring structure of the embodiment are mainly described, and the same components are denoted with the same reference numerals, and, the description thereof will be omitted.

Component 2

In the embodiment, the minus terminal of battery pack 12 is indirectly connected to the one end of outer conductor 4*b* through insulation part 6. Conversely, in the comparative example, the minus terminal of battery pack 12 is directly connected to the one end of outer conductor 4*b*.

Component 3

In the embodiment, the other end of load 32 is indirectly connected to the other end of outer conductor 5*b* through insulation part 7.

Conversely, in the comparative example, the other end of load 32 is directly connected to the other end of outer conductor 5*b*.

Ground of Wiring Structure of Comparative Example

With the wiring structure composed of component 1 (battery), component 2 and shield wire 4, the ground side terminal of noise source NS is connected to the other end of outer conductor 4*b*. In addition, the minus terminal of battery pack 12 is connected to the one end of outer conductor 4*b*. In this manner, the current from noise source NS flows from the minus terminal of battery pack 12 to chassis ground SG, and returns to noise source NS through chassis ground SG, thus forming ground loop GL1. As a result, generation of radio noise cannot be prevented.

With the wiring structure composed of component 2, component 3 and shield wire 5, the ground side terminal of noise source NS is connected to one end of outer conductor 5*b*. In addition, the other end of load 32 is connected to the other end of outer conductor 5*b*. In this manner, the current from noise source NS flows from the other end of load 32 to chassis ground SG, and returns to noise source NS through chassis ground SG, thus forming ground loop GL2. As a result, generation of radio noise cannot be prevented.

The wiring structure of the present embodiment includes two electrical/electronic components 2 and 3 mounted in a vehicle and including respective shield cases 21 and 31 connected to chassis ground SG; and shield wire 5 including center conductor 5*a* and outer conductor 5*b* covering the outer periphery of the center conductor 5*a*. Both ends of shield wire 5 are extended to shield cases 21 and 31. At least one of shield cases 21 and 31 includes insulation part 7. Outer conductor 5*b* of one end of shield wire 5 extended to the other shield case is connected to insulation part 7.

With the above-described configuration, in the case where component 2 has noise source NS and component 3 includes load 32, ground loop GL2 is not formed because the current from noise source NS does not flow from the other end of load 32 to chassis ground SG and does not return to noise source NS through chassis ground SG. In this manner, the generation of radio noise can be prevented.

In addition, in the wiring structure of the present embodiment, insulation part 7 includes a painted part that is insulation-painted in shield case 31. In this manner, insulation part 7 and shield case 31 are integrated, which can reduce the manufacturing cost and assembly cost.

The above-mentioned embodiments are merely examples of embodiments for implementing the present disclosure, and the technical scope of the present disclosure should not be interpreted as limited by them. In other words, the present disclosure can be implemented in various forms without deviating from its gist or main features.

The present disclosure is suitable for an electric vehicle including a wiring structure that needs to prevent the generation of radio noise.

The invention claimed is:

1. A wiring structure comprising:

a first electrical/electronic component mounted in a vehicle, the first electrical/electronic component including a first shield case connected to a chassis ground;

a second electrical/electronic component mounted in the vehicle, the second electrical/electronic component including a second shield case connected to the chassis ground; and a shield wire including:

a center conductor, and an outer conductor covering an outer periphery of the center conductor, wherein both ends of the shield wire are extended to the first shield case and the second shield case, respectively, wherein the first electrical/electronic component further includes a noise source, wherein one terminal of the noise source is connected to the center conductor at one end of the shield wire, wherein another terminal of the noise source is connected to the outer conductor at the one end of the shield wire, wherein the outer conductor at the one end of the shield wire is connected to the first shield case, wherein the second shield case includes an insulation part, wherein one terminal of the second electrical/electronic component is connected to the center conductor at another end of the shield wire, wherein another terminal of the second electrical/electronic component is connected to the second shield case through the insulation part, and wherein the outer conductor at the another end of the shield wire is connected to the second shield case through the insulation part.

2. The wiring structure according to claim 1, wherein the insulation part includes a painted part that is insulation-painted in the at least one of the shield cases.

* * * * *